(12) United States Patent
Di Stefano et al.

(10) Patent No.: US 8,720,875 B2
(45) Date of Patent: May 13, 2014

(54) CARRIER FOR HOLDING MICROELECTRONIC DEVICES

(75) Inventors: Thomas H. Di Stefano, Monte Sereno, CA (US); Peter T. Di Stefano, San Jose, CA (US)

(73) Assignee: Centipede Systems, Inc., San Jose, CA (US)

( * ) Notice: Subject to any disclaimer, the term of this patent is extended or adjusted under 35 U.S.C. 154(b) by 594 days.

(21) Appl. No.: 12/890,512

(22) Filed: Sep. 24, 2010

(65) Prior Publication Data

US 2011/0074080 A1 Mar. 31, 2011

Related U.S. Application Data

(60) Provisional application No. 61/246,124, filed on Sep. 26, 2009.

(51) Int. Cl.
*B65D 85/00* (2006.01)
*B23Q 1/64* (2006.01)
*B23Q 3/00* (2006.01)

(52) U.S. Cl.
USPC .................. 269/56; 269/287; 206/701

(58) Field of Classification Search
USPC .............. 269/46, 56, 309; 206/714, 721, 725, 206/583, 900, 701, 710, 712; 224/929; 267/136; 29/281.1, 281.4
See application file for complete search history.

(56) References Cited

U.S. PATENT DOCUMENTS

| | | | |
|---|---|---|---|
| 4,147,889 A | 4/1979 | Andrews et al. | |
| 4,881,639 A | 11/1989 | Matsuoka et al. | |
| 5,366,073 A | 11/1994 | Turrentine et al. | |
| 5,494,169 A | 2/1996 | Matsuoka | |
| 5,717,162 A | 2/1998 | Matsuoka | |
| 5,742,487 A | 4/1998 | Kobayashi et al. | |
| 5,758,776 A | 6/1998 | Slocum et al. | |
| 5,786,704 A | 7/1998 | Kim | |
| 5,960,961 A | 10/1999 | Gutentag | |
| 6,021,904 A | 2/2000 | Kozol et al. | |
| 6,179,127 B1 | 1/2001 | Kato et al. | |
| 6,474,477 B1 | 11/2002 | Chang | |
| 6,535,007 B2 | 3/2003 | Haas et al. | |
| 6,627,483 B2 | 9/2003 | Ondricek et al. | |
| D496,339 S | 9/2004 | Stanley | |
| 6,864,568 B2 | 3/2005 | Kohno et al. | |
| D589,010 S | 3/2009 | Di Stefano | |
| D589,011 S | 3/2009 | Di Stefano | |
| 2002/0057963 A1 | 5/2002 | Peterson et al. | |
| 2004/0155646 A1 | 8/2004 | Hoppe | |
| 2005/0072715 A1* | 4/2005 | Pylant et al. .................. 206/706 |
| 2006/0071656 A1 | 4/2006 | Joung et al. | |
| 2006/0226000 A1 | 10/2006 | Hanson et al. | |
| 2007/0292248 A1* | 12/2007 | Thallner ....................... 414/403 |
| 2009/0104014 A1* | 4/2009 | Satou et al. .................. 414/806 |
| 2010/0206768 A1 | 8/2010 | Hofmann | |
| 2011/0042265 A1* | 2/2011 | Hofmann et al. ............. 206/701 |

OTHER PUBLICATIONS

PCT Search report and Written Opinion mailed Nov. 23, 2010.
PCT Search report and Written Opinion mailed Jan. 11, 2011.

* cited by examiner

*Primary Examiner* — Lee D Wilson
*Assistant Examiner* — Jamal Daniel
(74) *Attorney, Agent, or Firm* — Michael B. Einschlag

(57) ABSTRACT

One embodiment is a carrier for holding devices that includes a tray having one or more sites in which a device may be held, and a frame resiliently coupled to the tray so the tray is movable with respect to the frame.

7 Claims, 9 Drawing Sheets

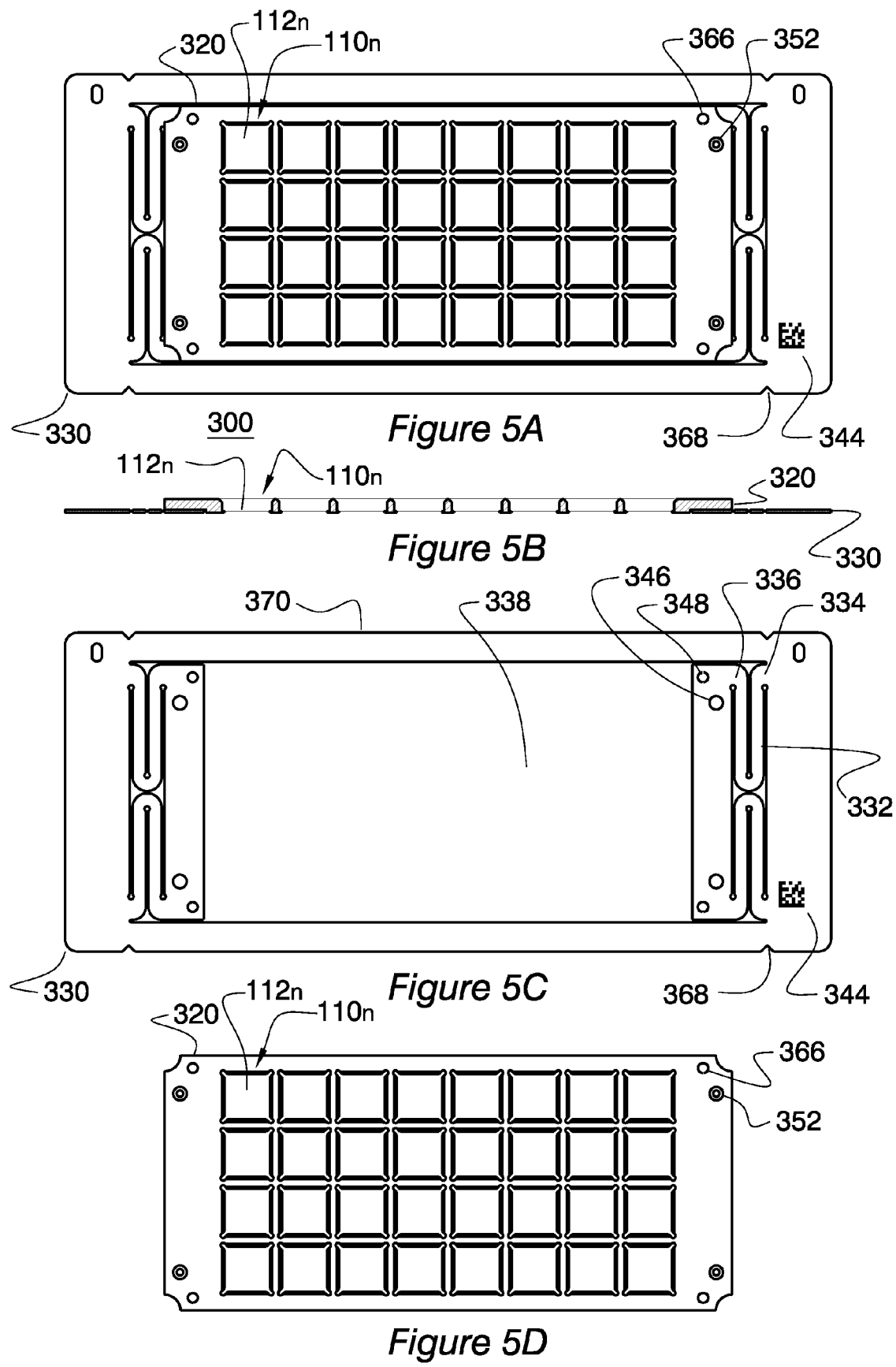

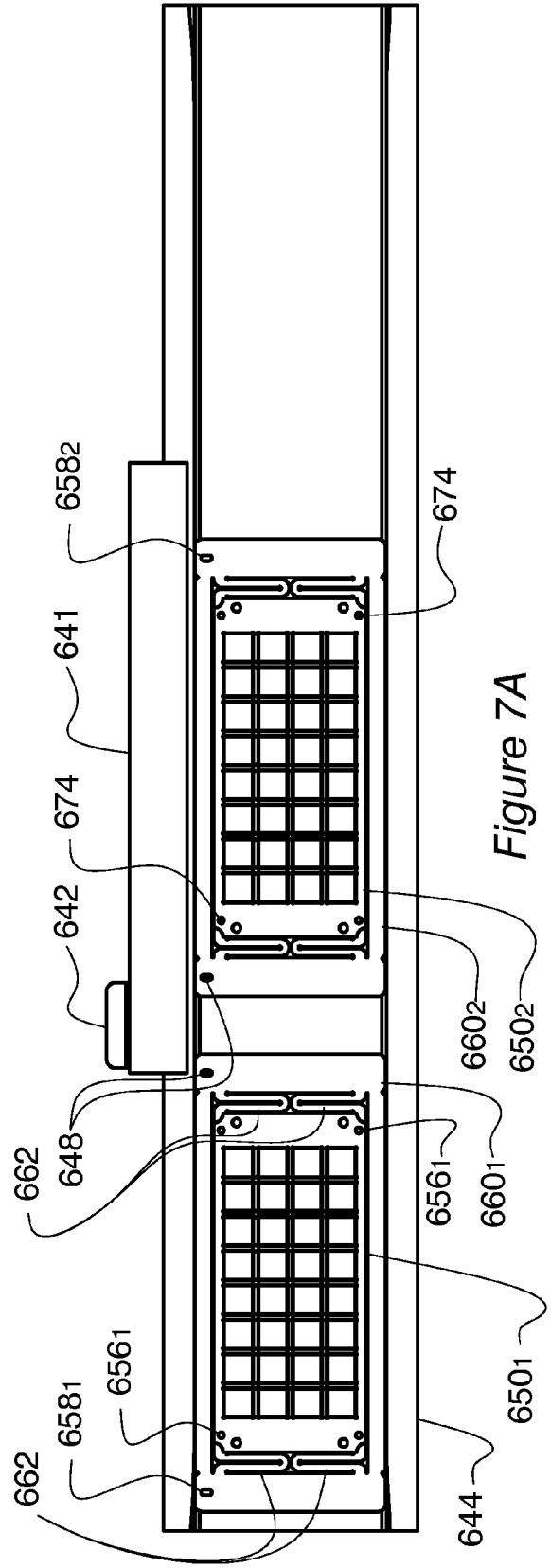
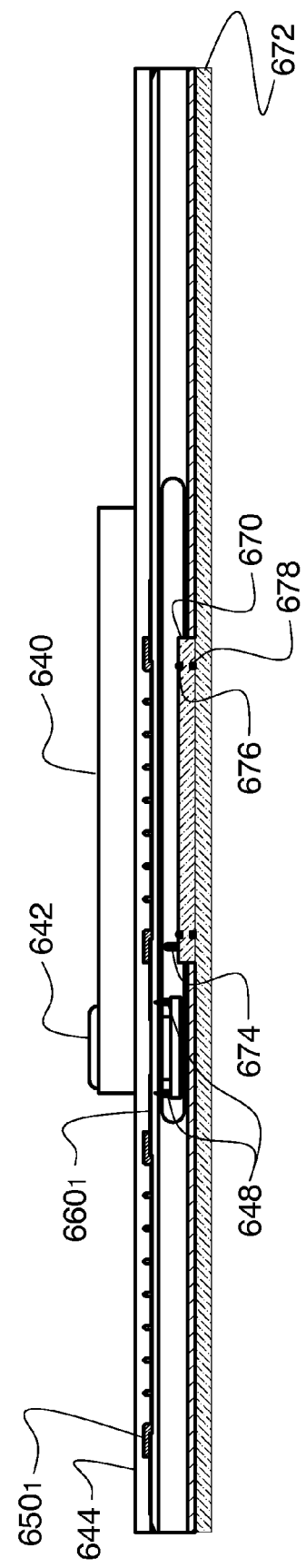
Figure 7A
Figure 7B

CARRIER FOR HOLDING MICROELECTRONIC DEVICES

This patent application relates to U.S. Provisional Application No. 61/246,124 filed Sep. 26, 2009 from which priority is claimed under 35 USC §119(e), and which provisional application is incorporated herein in its entirety.

CROSS-REFERENCE TO RELATED APPLICATIONS

This application is related to the following application which is owned by the assignee of this application: a related application entitled "Transport Apparatus for Moving Trays of Test Parts," which related application was filed the same day this application was filed.

TECHNICAL FIELD OF THE INVENTION

One or more embodiments of the present invention relate to method and apparatus for holding and transporting devices such as, for example and without limitation, microelectronic devices, to enable one or more procedures such as, for example and without limitation, test and/or burn-in, and more specifically to method and apparatus for holding an array of microelectronic devices in a movable tray adapted for making electrical contact to an electronic test equipment.

BACKGROUND

Semiconductor processing is an increasingly complex and mature technology for which the cost of test and burn-in consumes an ever larger share of production costs. However, continuous progress is being made in semiconductor technology and wafer fabrication efficiency, where such progress can be characterized by Moore's law which has successfully predicted a doubling of the number of devices on a semiconductor chip every two years. Productivity gains from advances in semiconductor technology and wafer fabrication efficiency underlie the modern economy, making possible mobile electronics, Internet communications and much of modern life. However, semiconductor packaging and testing have not maintained the same pace of technological progress.

Methods commonly used for contacting individual, separated semiconductor chips during testing have remained largely the same for decades. For example, after wafer probe testing, a wafer is sawn apart into individual chips. Then, additional packaging steps may be used to protect the chip and facilitate its attachment into an electronic system. After packaging, each chip is inserted into a first socket to test for opens and shorts. Each chip is then released from the first socket and transported in a tray. In an optional next step, the chip is inserted into a second (burn-in) socket and burned-in for eight hours at an elevated temperature of about 125° C. After burn-in, the chip is removed from the burn-in socket and transported in a tray to final test where it is inserted into a third socket. A comprehensive set of tests is done in final test, which tests are typically done at several speeds, voltages and temperatures. The socketing, sockets, fixtures, test boards and handling involved with the process of testing individual chips and other microelectronic devices present increasing problems in streamlining the production of semiconductor devices.

Attempts have been made to eliminate the need for individual sockets in test and burn-in, with limited success, in certain segments of the industry. For example, wafer probe testing using full wafer contactors has been used to test and burn-in all chips on a wafer in parallel, simultaneously. In DRAM and FLASH memory production, wafer probe testing is now being done in parallel for each chip on a wafer. However, at present, cost and performance limitations prevent the practical use of full wafer contactors to burn-in and performance test all chips on a wafer. In particular, for more complex chips such as microprocessors, signal processors, ASICS and communications chips, the high I/O count, power and performance associated with these complex chips prevent use of full wafer contactors for anything other than simple wafer probe testing at best. Although considerable resources, including work in university, U.S. government and industrial laboratories, have been devoted to full wafer burn-in and speed testing, the problem of finding a practical solution remains unsolved.

Other attempts to test and burn-in devices have been made which entail contacting a strip of partially packaged chips. In the process of packaging semiconductor chips as chip scale packages (CSPs) or ball grid arrays (BGAs), an array of chips is held together in a strip format. An array contactor is then used to test and burn-in arrays of chips in the strip format by having the array contactor contact terminals on each partially packaged chip without using an individual chip socket. After testing, the process of packaging the chips is completed, and the strip is sawn into individual finished devices. While testing in a strip format eliminates the need for individual costly sockets for some electrical tests, strip testing is only applicable to packages that are processed in strip format. Dimensional stability limits the application of testing in a strip format to relatively small array sizes and low densities due to problems with alignment of terminals on devices to corresponding contactors. A further limitation results from a complication of the process flow wherein devices leave a packaging area to be tested in a test facility, and then return to packaging for finishing and singulation into individual devices.

Another approach involves placing chips, whether packaged or not, in an accurately positioned array on a carrier. The carrier is moved automatically through the process on tracks or belts. In order to test devices in the carrier, the carrier is physically picked up and placed accurately on the contactor. After testing, the carrier is extracted from the contactor and physically placed back on a track for automatic transport to a next operation. A complex, slow and expensive mechanical apparatus is required to place the carrier accurately on a mating contactor.

SUMMARY

One or more embodiments of the present invention solve one or more of the above-identified problems by providing a carrier which releasably holds a device, for example and without limitation, a microelectronic device wherein the device is positioned with respect to the carrier. In accordance with one or more such embodiments, the carrier is positioned with respect to contact probes for test or burn-in of the device.

In particular, one embodiment of the present invention is a carrier for holding microelectronic devices that comprises: (a) a tray having one or more sites adapted to hold a microelectronic device; and (b) a frame resiliently coupled to the tray so the tray is movable with respect to the frame.

BRIEF DESCRIPTION OF THE DRAWINGS

FIG. 1B shows one device removed from its position in the carrier—which carrier is fabricated in accordance with one or more embodiments of the present invention.

FIGS. 5A and 5B are top view and cross sectional views, respectively, of a carrier for holding microelectronic devices, which carrier is fabricated in accordance with one or more embodiments of the present invention.

FIGS. 5C and 5D are top views of the frame and a tray, respectively, of the carrier shown in FIG. 5A.

FIGS. 7A and 7B are a top view and a cross sectional view, respectively, of a transport mechanism for moving carriers onto and off a test site, which transport mechanism is fabricated in accordance with one or more embodiments of the present invention.

FIG. 8B shows the tray in a retracted configuration; (b) FIG. 8C shows a test head urging the tray to an extended configuration; and (c) FIG. 8D shows the tray in the extended configuration while a thermal plate is urged into contact with an array of devices under test.

DETAILED DESCRIPTION

Figure 1A:
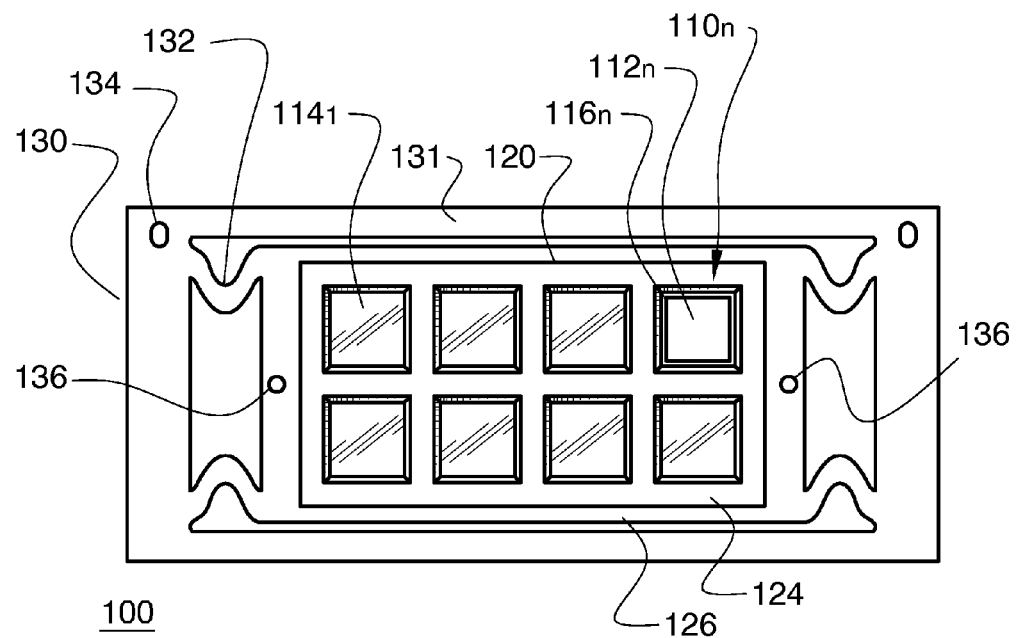
FIGS. 1A and 1B are top and perspective views, respectively, of a carrier for holding an array of microelectronic devices, where

In accordance with one or more embodiments of the present invention, a carrier is provided for holding devices, for example and without limitation, microelectronic devices, in place in an array so the devices may be: (a) moved to a test position that includes, for example and without limitation, a contactor block (the term "contactor block" refers to an array of connectors or contactors, and the term "contactor" refers to a connector such as, for example and without limitation, a spring pin such as a Pogo® spring pin) such as, for example and without limitation, a test socket; and (b) aligned with mating contactors, for example and without limitation, test contactors (for example, an electrode terminal of a socket), in the contactor block, for example and without limitation, the test socket.

As used herein, the term device is used in the broadest sense and includes, without limitation, an electronic device and a microelectronic device including a semiconductor chip, a flip chip, a packaged electronic circuit, a hybrid circuit, a daughter card, a multi-chip module, and the like. As further non-limiting examples of the types of microelectronic devices which may be held in a carrier fabricated in accordance with one or more embodiments of the present invention are BGAs (as used herein the term BGA, or ball grid array, is a two dimensional array of solder bump terminals on a microelectronic device), CSPs (as used herein, the term CSP is a chip scale package), flip-chips, wafer level packages (WLPs), TSVs (as used herein, the term TSV is a through silicon via device), bare semiconductor dice, MEMS, and multi-chip modules.

As used herein, the terms up, down, top and bottom generally refer to an orientation with respect to figures showing aspects of embodiments of the present invention. These terms are not intended to describe orientation with respect to a gravitational field, but rather are used to facilitate description of aspects of embodiments of the present invention as illustrated in the figures. As used herein, the expression "respectively" means that a first item in a first list relates to a first item in a second list; a second item in the first list relates to a second item in the second list; and so forth.

In accordance with one or more embodiments of the present invention, a carrier comprises a frame that is resiliently coupled to a tray, which frame includes two or more flexible links, for example and without limitation, springs, that are disposed so the tray may be resiliently moved relative to the frame (for example and without limitation, moved perpendicular to a plane associated with the frame such as an aperture in which the tray may be disposed). In accordance with one or more such embodiments, the tray includes a plurality of apertures disposed in an array of sites, wherein each site is a location within the tray that is adapted to hold a unitary module (typically a unitary module is one device; however, the unitary module may be comprised of multiple devices). In accordance with one or more embodiments of the present invention, a carrier comprises a tray that is separable from, and is attachable to, a frame, for example and without limitation, by attachment to springs or to a structure that is coupled to the springs—for example and without limitation, the tray may be a molded plastic tray with apertures therethrough. Alternatively, in accordance with one or more further embodiments of the present invention, a carrier comprises a frame that includes a tray and flexible links that are disposed so the tray may be resiliently moved relative to the frame (for example and without limitation, moved perpendicular to a plane associated with the frame such as an aperture in which the tray may be disposed), wherein the tray is an integral part of the frame.

Figure 1B:
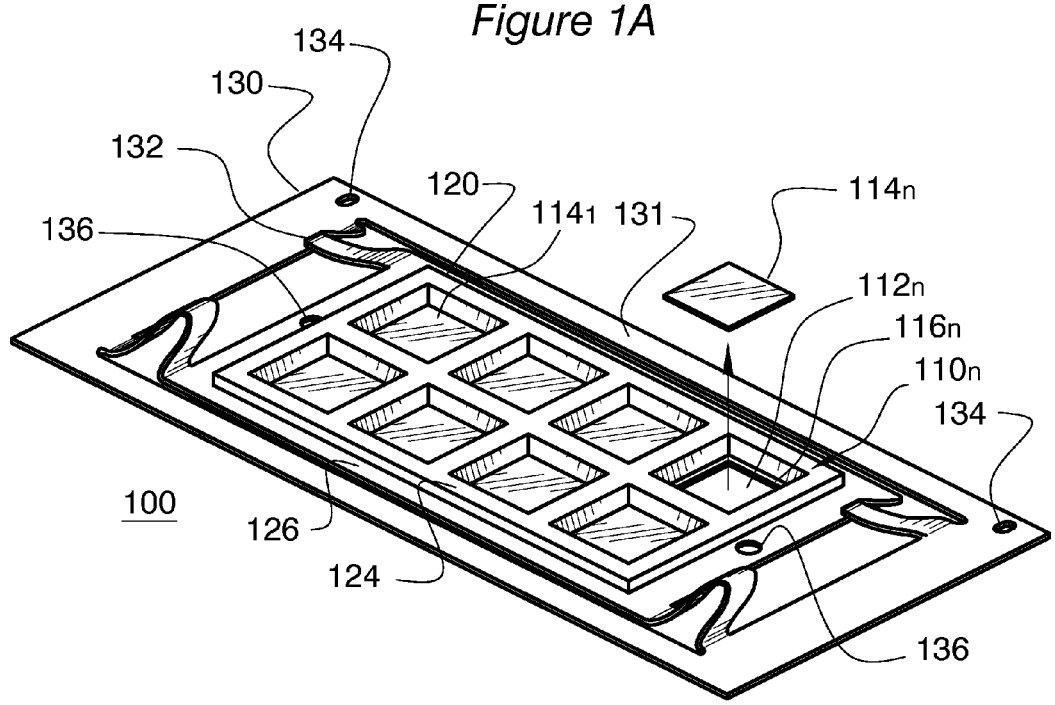

FIGS. 1A and 1B are top and perspective views respectively of carrier 100 for holding microelectronic devices, which carrier 100 is fabricated in accordance with one or more embodiments of the present invention. As shown in FIG. 1A, carrier 100 includes tray 120 which is detachably attached to frame 130. As further shown in FIG. 1A, a plurality of microelectronic devices $114_n$ are held in place at sites $110_n$ of tray 120, thereby enabling devices $114_n$ to be transported, in alignment as a group, by carrier 100 to and from, for example and without limitation, contactors for a purpose, for example and without limitation, of making test connections, for example and without limitation, temporary test connections, to devices $114_n$. To avoid cluttering the figures, and for ease of description and understanding, numerical labeling of each site, each device, and the like is omitted, and instead, a single such site is labeled as $110_n$, a single such device is labeled $114_n$, and so forth. In accordance with one or more embodiments of the present invention, and as indicated in FIG. 1B, each of an array of devices $114_n$ is held in an aperture $112_n$ at site $110_n$ of tray 120 of carrier 100 (device $114_1$ is shown in position in site $110_1$ of tray 120). As shown in FIG. 1B, aperture $112_n$ has sloping sides that help guide devices into apertures at sites $110_n$ of tray 120. Further, in accordance with one or more such embodiments, device $114_n$, is prevented from falling through aperture $112_n$, by retaining feature $116_n$ which may be, for example and without limitation, a ledge (refer to FIG. 1B). As such, apertures $112_n$ are adapted to hold devices $114_n$ so that each device $114_n$ is registered to its individual site $110_n$.

As further shown in FIGS. 1A and 1B, frame 130 includes outer frame 131 (for example and without limitation, outer frame 131 has a rectangular shape which is disposed about an outer open area) and inner frame 126 (for example and without limitation, inner frame 126 has a rectangular shape which is disposed about an inner open area). Inner frame 126 is disposed inside the open area encompassed by outer frame 131, and inner frame 126 is resiliently coupled to outer frame 131 by springs $132_n$ (note that springs $132_n$ are not disposed in a plane). In addition, and as further shown in FIGS. 1A and 1B, tray 120 is attached to inner frame 126. As a result, and as indicated in FIG. 1B, inner frame 126, and hence tray 120, may be moved relative to outer frame 131, and in particular, tray 120 may be moved in a direction perpendicular to a plane of outer frame 131.

In accordance with one or more embodiments of the present invention, frame 130 includes alignment features 136 that may be used to align carrier 100 to a mating element such as, for example and without limitation, a contactor block, test socket, a burn-in socket, or a processing head. In accordance with one or more such embodiments of the present invention, as shown in FIGS. 1A and 1B, alignment features 136 include one or more features, for example and without limitation, slots disposed in inner frame 126. In addition, and in accordance with one or more embodiments of the present invention, frame 130 includes one or more engagement mechanisms, for example and without limitation, slots 134, disposed in outer frame 131, for example and without limitation, at each end of frame 130, for use in engaging transport mechanisms to move carrier 100, for example and without limitation, from one processing station to another.

In accordance with one or more embodiments of the present invention, apertures $112_n$ may extend through the body of tray 120 (refer to FIG. 1B), thereby enabling access to top surfaces of devices $114_n$, for example and without limitation, for direct chip cooling, while enabling access to bottom surfaces of devices $114_n$, for example and without limitation, for connection to contactor probes of a test socket. Alternatively, in accordance with one or more alternative embodiments of the present invention, apertures $112_n$ may have a bottom structure, for example and without limitation, ledge $116_n$, so that devices $114_n$ are prevented from falling downward and out of aperture $112_n$. In accordance with one or more such alternative embodiments of the present invention, the bottom structure may comprise one or more tabs, one or more ledges, one or more protrusions, a thin sheet with a grid of holes therethrough, a sheet of material with or without apertures therein, and so forth. In accordance with one or more such embodiments, the bottom structure comprises a thin sheet of copper, copper alloy, steel, polyimide, or other suitable material. In accordance with one or more further embodiments, the bottom structure comprises a thin sheet with embedded contactors disposed through the sheet whereby electrical connections may be made between terminals on bottom surfaces of devices $114_n$ and corresponding terminals of a mating socket. Embedded contactors may include, without limitation, terminals with roughened surfaces, spring probes, resilient metal vias, cantilever probes, buckling beam probes, flat spring probes, and the like.

While tray 120, as shown in FIGS. 1A and 1B, is substantially planar, it will be understood by one of ordinary skill in the art that trays fabricated in accordance with one or more embodiments of the present invention may include features that facilitate loading and unloading of various types of microelectronic devices. For example and without limitation, beveled "picture frames" may be added to each site $110_n$ to guide devices into apertures like aperture $112_n$. In accordance with one or more such embodiments of the present invention, a beveled picture frame may be formed individually, i.e., with one picture frame per site, or beveled picture frames may be formed in an array that is attached to planar tray 120. As used herein, a picture frame, typically fabricated from molded plastic material, is a frame is used to guide a device into an aperture in the tray. FIGS. 2B and 2C show cross sectional views of tray 120 for holding devices that is fabricated in accordance with one or more embodiments of the present invention. As one of ordinary skill in the art can readily appreciate, many embodiments of tray 120 may be fabricated that include variations from the beveled picture frame shown in FIGS. 2B and 2C. For example and without limitation, a portion of the picture frame need not surround each site (for example, a picture frame portion associated with a site need not include four (4) sides), or even be present at each site. In addition, tray 120 may include recesses to enable cams to be inserted a predetermined distance therein to provide access to actuating edges of retaining prongs (not shown) that may be incorporated into each site $110_n$ of tray 120.

In accordance with one or more embodiments of the present invention, a tray may be fabricated using any one of a number of conventionally practiced methods of plastic molding. For example and without limitation, suitable plastics for fabricating a tray include: FR-4 epoxy, liquid crystal polymer, polyether ether ketone (PEEK), polyether sulfone (PES), polyamide-imide (Torlon® available from Quadrant Engineering Plastics of Reading, Pa.) and Semitron 410C Ultem® plastic material available from Boedeker Plastics of Shiner, Tex. (Ultem is a trademark of GE Plastics).

In accordance with one or more embodiments of the present invention, and as shown in FIGS. 1A and 1B, tray 120 includes seal band 124 which encircles sites $110_n$ to provide a top sealing surface for tray 120 when carrier 100 is used in the manner described below. In accordance with one or more such embodiments of the present invention, and as shown in FIG. 1B, seal band 124 is a solid band of material disposed around a periphery of tray 120 so as to encircle device receiving sites $110_n$. As further shown in FIG. 2B, seal band 124 provides top sealing surface 104 for tray 120, and a portion of a surface of the bottom of tray 120, for example, a flat portion, provides bottom sealing surface 106 for tray 120. In accordance with one or more such embodiments, seal band 124 is a solid band of material disposed on, or formed as a portion of, tray 120 (refer to FIG. 1B).

In accordance with one or more embodiments of the present invention, frame 130 may be fabricated from a sheet of full hardness, tempered 304 stainless steel having, for example and without limitation, a thickness of about 0.50 mm. In accordance with one or more such embodiments, the features of frame 130 shown in FIGS. 1A and 1B and described above may be laser cut in full hardness, tempered 304 stainless steel sheet to an accuracy of ±5 micrometers. In accordance with one or more alternative embodiments, frame 130 may be made of a material including, without limitation, stainless steel, tempered steel, Monel 500, glass fiber reinforced polyimide, aramid fiber reinforced polyimide (available from Arlon Materials for Electronics, a Division of WHX Corporation, of Rancho Cucamonga, Calif.), NiTi shape memory alloy (available from National Electronic Alloys, Inc. of Santa Ana, Calif.), carbon fiber reinforced polymer, or a resilient plastic material.

In accordance with one or more further embodiments of the present invention, frame 130 of carrier 100 may be stamped, water jet cut, punched, etched, laser cut, or otherwise formed, to include alignment features, orientation features, stops, stacking elements, bottom stops and the like, that facilitate the use of carriers across a wide spectrum of applications (see the further description below). In addition, and in accordance with one or more embodiments of the present invention, the thickness of frame 130 may be adapted to the devices being held in the carrier (note that in accordance with one or more embodiments, at some or all sites, the devices may be thicker than the tray, and in accordance with one or more further embodiments, frame 130 may be thicker than tray 120). In particular, frame 130 may be fabricated over a large range of thicknesses. For example and without limitation, frame 130 may be fabricated from a thin sheet having a thickness of about 0.1 mm for use, for example and without limitation, in flip chip applications, and frame 130 may be fabricated from a molded plastic sheet having a thickness of about 5 mm for use, for example and without limitation, MEMS pressure sensor devices. In yet further examples, frame 130 may be made from the same sheet of material as that used to fabricate tray 120 to form a unitary carrier comprised of a tray resiliently coupled to a frame.

Figure 2A:
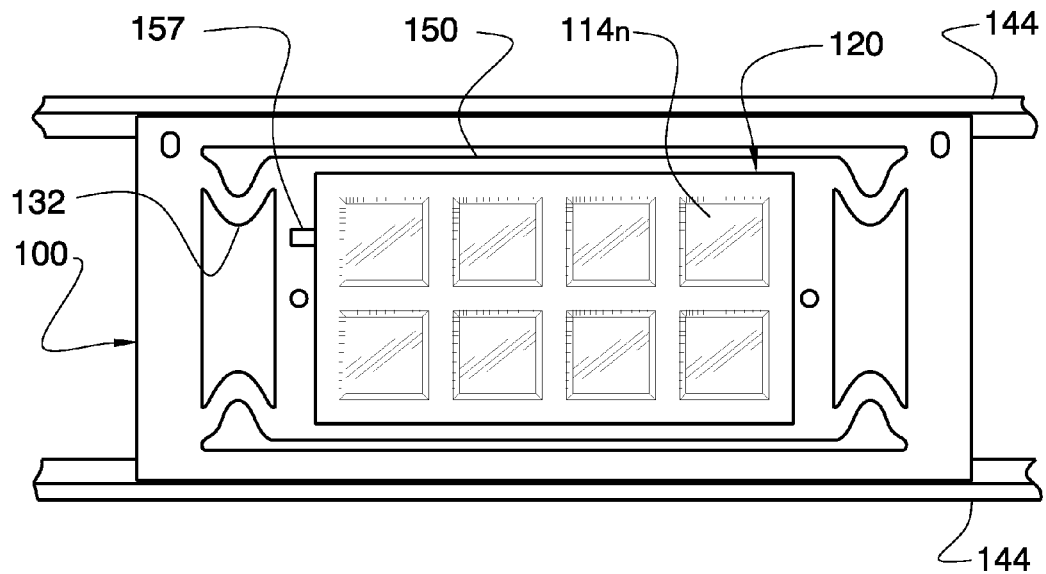
FIG. 2A is a top view of a carrier holding an array of microelectronic devices, which carrier is disposed on transport rails used to transport the carrier and which carrier is fabricated in accordance with one or more embodiments of the present invention.
Figure 2B:
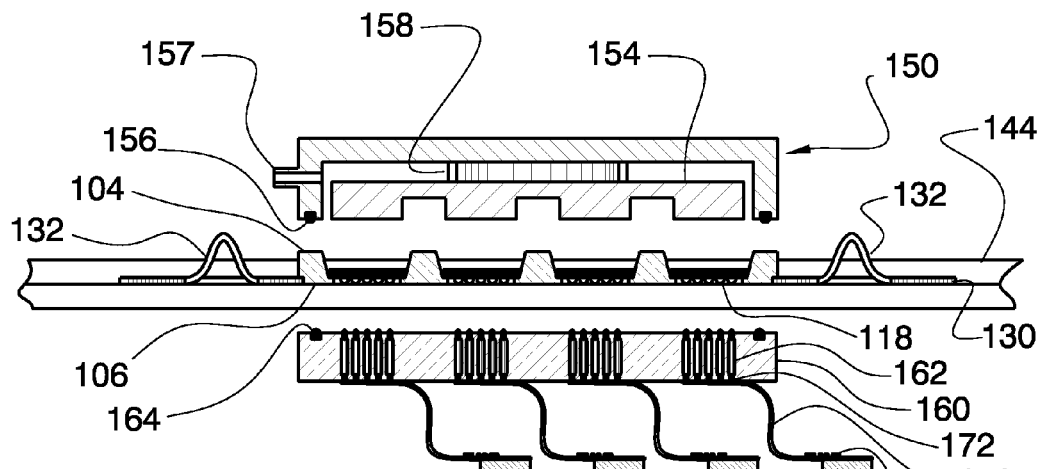
FIGS. 2B-2C are cross sectional views of the carrier holding an array of microelectronic devices, which carrier is fabricated in accordance with one or more embodiments of the present invention, the carrier is shown: (a) in FIG. 2B, positioned under a test head where the devices are juxtaposed to corresponding terminals on a contactor positioned under the carrier; and (b) in FIG. 2C, with the array of devices urged into contact with corresponding terminals of the contactor.
Figure 2C:
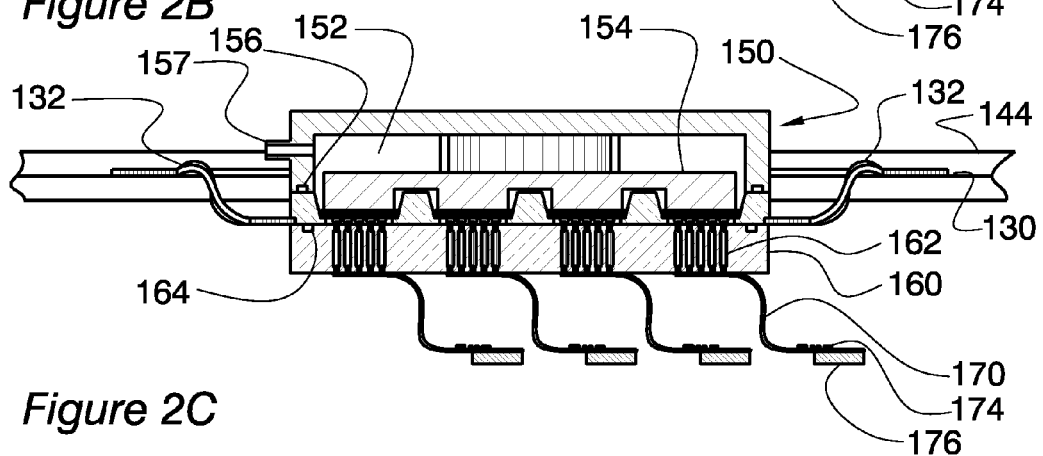

FIG. 2A is a top view of carrier 100 holding an array of microelectronic devices $114_n$ (shown in phantom), which carrier 100 is disposed on transport rails 144 that are used to transport carrier 100. FIGS. 2B-2C are cross sectional views of carrier 100 (shown in FIG. 2A) holding the array of microelectronic devices $114_n$, where carrier 100 is shown: (a) in FIG. 2B, positioned under test head 150 (where test head 150 is an assembly that clamps devices $114_n$ to contactor block 160—for example, test head 150 may include a thermal transfer plate or a backing plate as appropriate) where devices $114_n$ in tray 120 are juxtaposed to corresponding terminals on contactor block 160 positioned under carrier 100; and (b) in FIG. 2C, with the array of devices $114_n$ urged into contact with corresponding terminals of contactor 160 (by urging test head 150 downwardly onto tray 120, thereby moving tray 120 downward into contact with contactor block 160).

In a normal test operation in accordance with one or more embodiments of the present invention, carrier 100 is moved on transport rails 144 so that tray 120 is positioned directly under test head 150 and directly above contactor block 160 (refer to FIG. 2B). During such movement, devices $114_n$ (shown in phantom in FIG. 2A) move above contactor block 160 without mechanical interference because carrier 100 is (and more particularly, springs $132_n$ of frame 130 are) in a retracted configuration (the term "retracted configuration" refers a configuration of carrier 100, and hence springs $132_n$ of frame 130, for example and without limitation, where no external forces other than gravity act upon tray 120) wherein tray 120 is supported above a top surface of contactor block 160. In FIG. 2B, springs $132_n$ of frame 130 are shown in a retracted configuration wherein springs $132_n$ are relaxed (the term "relaxed" refers to a configuration where no significant external forces cause springs $132_n$ to be deformed from an unloaded configuration). In FIG. 2C, springs $132_n$ of frame 130 are shown in an extended configuration wherein tray 120 is displaced in a direction perpendicular to a plane of frame 130 to an extent sufficient to bring tray 120 into contact with contactor block 160. In the extended configuration, springs $132_n$ are distended, thereby enabling tray 120 to move relative to frame 130 and to enable backing plate 154 of test head 150 to urge devices $114_n$ into contact with connectors 162 of contactor block 160. As is well known to those of ordinary skill in the art, a backing plate is a plate that clamps devices $114_n$ to contactor block 160 (for example, and without limitation, the backing plate may be a thermal transfer or exchange plate or a cold plate or a heat sink). As further shown in FIG. 2C, terminals 118 on devices $114_n$ (i.e., conductive terminals on a microelectronic device) and corresponding contact pads 172 (for example, a contact may be a metal pad used to mate to a spring pin of a spring pin probe) on flexible printed wiring cable 170 are electrically connected by spring pin probes 162 interposed therebetween. During an electrical test operation, electrical signals are conducted between test electronics 174 and device under test $114_n$ (DUT $114_n$) by means of cables 170 and spring pin probes 162. Test results are relayed through connectors 176 to a tester mainframe (not shown). After the electrical test operation is complete, backing plate 154 is raised to release force applied thereby on devices $114_n$. This enables tray 120 to return to the retracted configuration shown in FIG. 2B wherein carrier 100 and devices $114_n$ held therein may be moved on transport rails 144 without mechanical interference between devices $114_n$ and backing plate 154 and between devices $114_n$ and contactor block 160.

In accordance one or more embodiments of the invention, and in more particular, a test sequence includes moving test head 150 so that seal ring 156 (for example, an O ring such as a silicone or elastomeric O-ring, or other sealing surface such as, for example and without limitation, a flat surface) is juxtaposed with top sealing surface 104 of seal band 124 of tray 120. Next, in accordance with one or more such embodiments, test head 150 is moved downward into contact with tray 120, thereby bringing seal ring 156 into contact with top sealing surface 104 of seal band 124. As test head 150 is moved further downward, bottom sealing surface 106 of tray 120 is urged into contact with seal ring 164 (for example, an O-ring such as a silicone or elastomeric O-ring, or other sealing surface such as, for example and without limitation, a flat surface) of contactor block 160. The test sequence further includes moving backing block 154 downward into contact with devices $114_n$ so that backing block 154 urges devices $114_n$ into contact with contactor block 160. To do this, and in accordance with one or more such embodiments, actuator 158 moves backing plate 154 in a downward direction relative to test head 150, thereby providing a controlled force on devices $114_n$ to establish: (a) good thermal contact between backing plate 154 and devices $114_n$; and (b) good electrical contact between terminals 118 of devices $114_n$ and corresponding contacts 172 of printed circuit cable 170. After moving and urging as described above, and as shown in FIG. 2C, devices $114_n$ are enclosed within a sealed cavity (also referred to herein as a "test cell") comprised of chamber 152 of test head 150, tray 120, contactor block 160, and flexible printed circuit cable 170. Next, a gas (for example and without limitation, nitrogen, forming gas, hydrogen, helium, dry air and mixtures thereof) may be introduced into the test cell, for example and without limitation, through port 157 of test head 150 to reduce moisture condensation and to increase thermal efficiency.

Figure 3A:
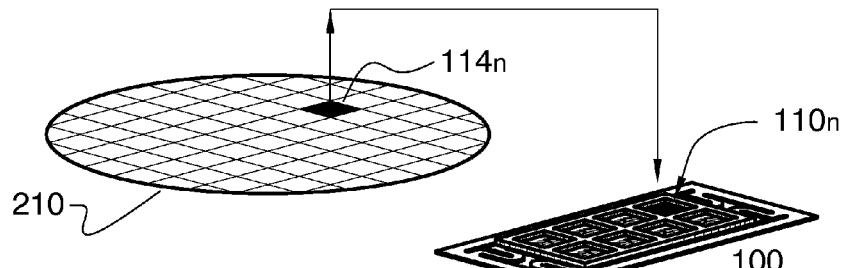
FIGS. 3A-3C are perspective views that illustrate several applications of a carrier for holding microelectronic devices, which carrier is fabricated in accordance with one or more embodiments of the present invention.
Figure 3B:
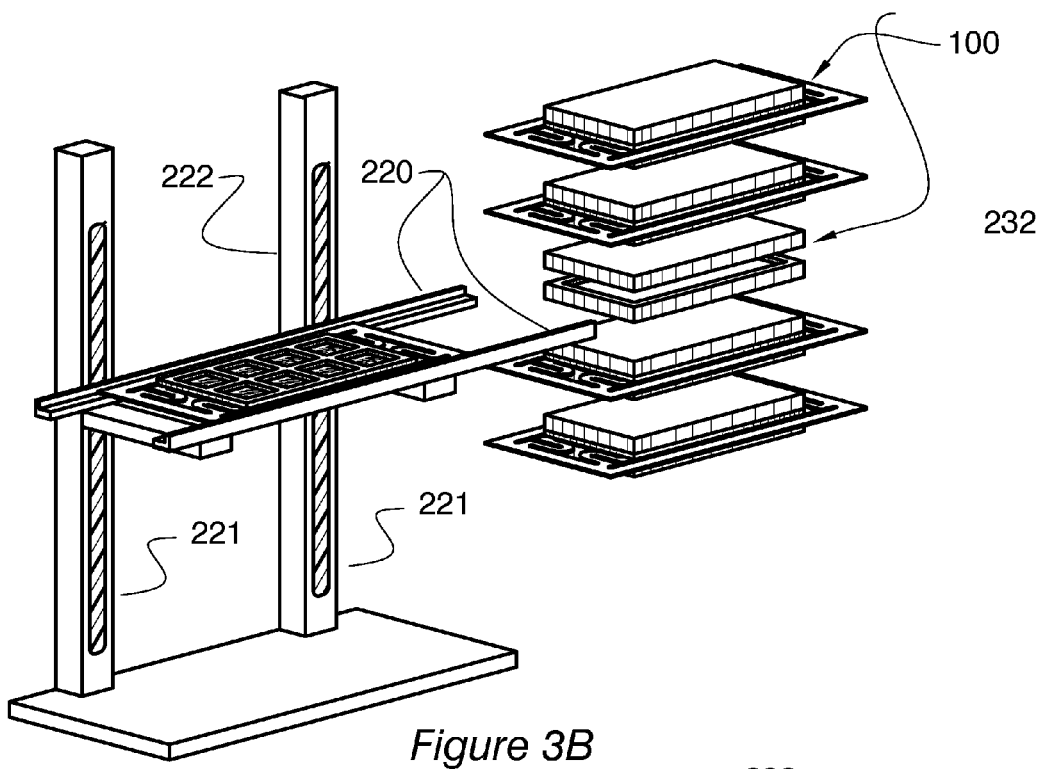
Figure 3C:
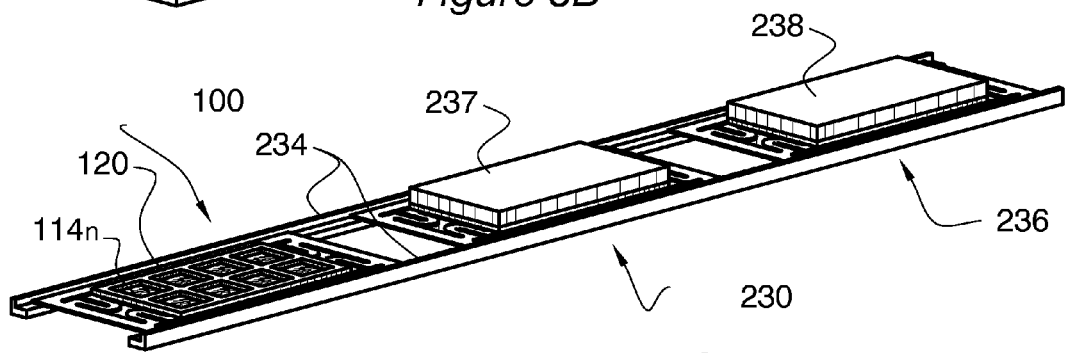

A carrier that is fabricated in accordance with one or more embodiments of the present invention may have a variety of uses in testing microelectronic devices, including without limitation, wafer picking, burn-in, functional testing, stress testing, laser trimming, marking, reflow of solder balls, and dynamic programming FIGS. 3A-3C are perspective views that illustrate several applications for one or more embodiments of a carrier that are fabricated in accordance with one or more embodiments of the present invention. As illustrated in FIG. 3A, bare dice are picked from sawn wafer 210 and are placed in carrier 100. By way of example, device $114_n$ is picked from sawn wafer 210, and is placed in site $110_n$ of carrier 100—pick and place equipment and the manner of operating the same to carry out this operation are well known to those of ordinary skill in the art. In addition, data specifying the location of device $114_n$ in site $110_n$ of carrier 100 may be collected by factory mechanization computers in accordance with any one of a number of methods that are well known to those of ordinary skill in the art. This data may be correlated, for example and without limitation, by such factory mechanization computers or by other computers, with data relating to the various process steps entailed in fabricating and testing device $114_n$ to enable forward and reverse traceability of device $114_n$ at any subsequent process or testing step and so forth performed while device $114_n$ is held in carrier 100.

As illustrated in FIG. 3B, carriers 100 are loaded with devices and are transported on rails 220 to burn-in pods 230. As shown in FIG. 3B, burn-in pod 232 of burn-in pods 230 is open and ready to receive carrier 100 being loaded from automatic loader 222 which moves carriers in a vertical direction into alignment with an available burn-in pod such as burn-in pod 232. As shown in FIG. 3B, automatic loader 220 is comprised of elevators 221, which elevators are well known to those of ordinary skill in the art. Burn-in pods such as burn-in pod 232 may be provided with thermal plates, sealed chambers, and drive electronics to facilitate a range of stress tests on devices $114_n$ under test (i.e., DUT $114_n$). In accordance with one or more such embodiments, connections are made from an array of DUTs in burn-in pods 230 (in the manner described above in conjunction with FIGS. 2B and 2C) to burn-in board(s), flexible circuit(s), rigid flex cable(s), high speed cable(s) or other high performance interconnect mechanism that enables location of test electronics in close proximity to the DUTs to perform testing at high speeds without the encumbrance of long interconnect cables. After burn-in, testing during burn-in, run-in, or other stress testing, carrier 100 of devices $114_n$ is removed from burn-in pod 232 using an automated transport, such as that described below, to, for example and without limitation, to automatic loader 222, and is transported by automatic loader 222 to a next process location.

As illustrated in FIG. 3C, arrays of devices $114_n$ held in a tray of carrier 100 resting on rails 234 may be shuttled from one process location to another by means of the automated transport. In one example, at a process location comprising burn-in pods 230, a tray of devices is pre-heated to a set temperature in pre-heating chamber 237 before being transported on rails 234 to next test location 236. In this example, devices $114_n$ entering test location 236 are maintained at the set temperature by thermal head 238. In accordance with one or more embodiments of the present invention, arrays of devices $114_n$ held in trays of carriers may be moved through a sequence of tests performed at different temperatures by concatenating pre-heat and test locations along rails 234 or other suitable transport means. As one of ordinary skill in the art can readily appreciate, in accordance with one or more embodiments of the present invention, carrier 100 may be used to transport arrays of devices into position automatically for a wide range of process and test operations.

Figure 4A:
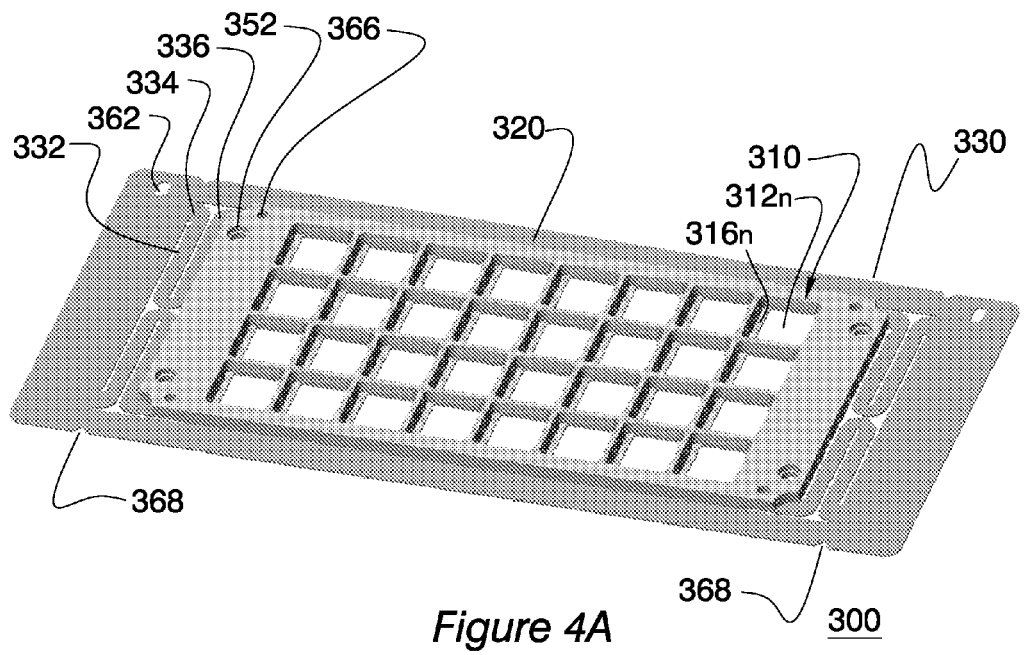
FIGS. 4A and 4B are perspective views of a carrier for holding microelectronic devices, which carrier is fabricated in accordance with one or more embodiments of the present invention, where a tray carried by the carrier is shown in a retracted configuration in FIG. 4A and in an extended configuration in FIG. 4B.
Figure 4B:
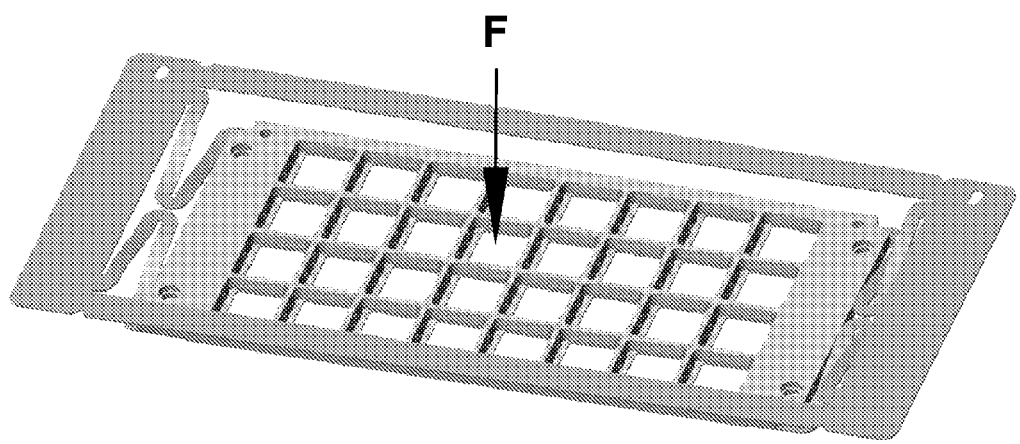

FIGS. 4A and 4B are perspective views of carrier 300 where tray 320 is shown in a retracted configuration and an extended configuration, respectively. As shown in FIG. 4A, carrier 300 comprises frame 330 and tray 320 which is coupled to frame 330 by being attached to flexural springs 332 of frame 330. As further shown in FIGS. 4A and 4B, tray 320 is provided with apertures $312_n$ that are adapted for holding devices (not shown) in an array of sites $310_n$, where each site $310_n$ has a retaining feature (ledge $316_n$) which is, for example and without limitation, a ledge, that prevents devices from falling through aperture $312_n$. As further shown in FIGS. 4A and 4B, tray 320 includes alignment features 366 that may be used to position tray 320 accurately with respect to an element such as, for example and without limitation, a contactor block, test socket, a burn-in socket, or a processing head. Trays in accordance with one or more embodiments of the present invention may be fabricated using any one of a number of conventionally practiced methods of plastic molding. For example and without limitation, suitable plastics for fabricating trays include Semitron 410C Ultem® plastic material available from Boedeker Plastics of Shiner, Tex. (Ultem is a trademark of GE Plastics). Tray 320 may also be fabricated of any insulative material or a metal with an insulative coating. The dielectric material in a high performance tray may be selected from a group of dimensionally stable polymer materials including, for example and without limitation: glass reinforced Torlon 5530 available from Quadrant Engineering Plastics, of Reading Pa.; Vespel; Ultem 2000 available from GE Inc.; carbon filled PEEK; liquid crystal polymer; aramid fiber reinforced polyimide sheet; and others. A high degree of dimensional stability may be achieved with trays of metals such as, for example and without limitation, brass, stainless steel, titanium alloy 6al-4v, or aluminum 7075, the metal body being provided with an insulative conformal coating of one or more dielectric materials that are well known in the electronic circuit board industry.

As shown in FIGS. 4A and 4B, and in accordance with one or more embodiments of the present invention, tray 320 is resiliently coupled to frame 330 by attachment to flexural springs 332. In accordance with one or more such embodiments, tray 320 is attached to flexural springs 332 by fastening means 352 which, for example and without limitation, may be PEM® nuts available from PEM Fastening Systems of Danboro, Pa. In accordance with one or more embodiments of the present invention, frame 330 may be fabricated from a material selected, for example and without limitation, from a group including, without limitation, stainless steel, carbon steel, surface hardened steel, Titanium alloy, aluminum 7075, beryllium copper, NiTiNol, fiber reinforced polyimide, FR-4 laminate material, aramid fiber reinforced polymer laminate materials, graphite epoxy composite laminates, and the like. In accordance with one or more embodiments of the present invention, frame 330 is made from a 0.5 mm thick, 301 stainless steel sheet, and springs 332 are flat springs cut from the same 301 stainless steel sheet as the body of frame 330. As shown in FIGS. 4A and 4B, flexural springs 332 are serpentine folded springs wherein ends 334 and 336 of springs 332 are in close proximity to reduce movement of tray 320 that is not in a direction perpendicular to a plane of frame 330. A force F (refer to FIG. 4B) acting upon tray 320 in a direction perpendicular to the plane of frame 330 displaces tray 320 to an extended configuration shown in FIG. 4B. Upon release of force F, tray 320 returns to a retracted configuration shown in FIG. 4A. In accordance with one or more embodiments of the present invention, slots 362 in frame 330, for example and without limitation, disposed at each end thereof, are provided for engagement with a transport drive mechanism (not shown) for moving carrier 300 from one station to another, and notches 368 in frame 330 are provided to enable alignment, for example and without limitation, by means of shot pins (not shown) that engage notch 368 laterally in response to a force being applied thereto in the plane of frame 330.

FIGS. 5A and 5B are top view and cross sectional views, respectively, of carrier 300 described above, and FIGS. 5C and 5D are top views of frame 330 and tray 320, respectively, carrier 300. As shown on FIGS. 5A and 5C, in accordance with one or more embodiments of the present invention, data matrix serialization mark 344 is positioned near one end of frame 330 and is provided for use in automatic machine reading an identity of carrier 300 by, for example and without limitation, an optional sensor on a transport apparatus. Mark 344 is fabricated in accordance with any one of a number of methods that are well known to those of ordinary skill in the art, and it enables tracking devices in tray 320 for forward and backward traceability from, for example and without limitation, picking a device from a sawn semiconductor wafer to, for example and without limitation, packing the device for final shipment.

In accordance with one or more embodiments, carrier 300 includes frame 330 and tray 320 which are shown separately in FIGS. 5C and 5D, respectively. In accordance with one or more such embodiments, and as shown in FIG. 5C, frame 330 comprises a sheet of resilient material having opening 338 therein that is adapted to receive tray 320. As further shown in FIG. 5C, each of springs 332 is attached to a body of frame 330 at distal end 334 and to a structure at proximal end 336, which structure is adapted to be affixed to tray 320, thereby coupling tray 320 to frame 330. In accordance with one or more such embodiments of the present invention, and as further shown in FIG. 5C, the structure is formed by joining the proximal ends of two flexural springs. Alternatively, the structure may be a flat piece of material conjoined to the ends of the two springs. In accordance with one or more such embodiments, the structure has features or holes for fasteners that attach the tray to the structure—alternatively, the tray may be attached to the structure using an adhesive (in accordance with further such embodiments, the structure may be absent, and the tray may be attached directly to ends of the springs). As further shown in FIG. 5C, frame 330 is provided with mounting holes 346 or other attachment means in the structure near proximal end 336 of flexural spring 332 (it should be understood that in accordance with other embodiments, mounting holes 346 or other attachment means may be formed in the springs themselves). In accordance with one or more such embodiments, mounting holes 346 are adapted to receive fasteners for attachment such as, for example and without limitation, PEM nuts 352 in tray 320. Further, in accordance with one or more such embodiments of the present invention, holes 348 in the structure near proximal end 336 of flexural spring 332 enable alignment pins (which are supplied for example and without limitation, by a contactor array) to pass therethrough (it should be understood that in accordance with other embodiments, mounting holes 348 or other alignment mechanisms may be formed in the springs themselves).

In accordance with one or more embodiments of the present invention, proximal ends 336 of folded serpentine flexural springs 332 (and the structure, if provided) are resiliently movable in a direction perpendicular to the body of frame 330 (the body of frame 330 includes side sections 370 having surfaces adapted to be slidably supported on rails (shown in FIGS. 7A and 7B)). In accordance with one or more embodiments of the present invention, notches 368 are provided along one or more of side sections 370 of frame 300 to enable engagement therewith by shot pins (not shown) that hold frame 330 in position on supporting rails (as shown in FIGS. 7A and 7B). In accordance with one or more embodiments of the present invention, tray 320 shown in FIG. 5D is adapted to be disposed in opening 338 of frame 330 and to be coupled to frame 330 by means of, for example and without limitation, PEM nut fasteners 352. In accordance with one or more embodiments of the present invention, tray 320 may be fabricated independent of frame 330, for example, from molded plastic, or tray 320 may be fabricated integrally with frame 330 from one sheet of material.

Figure 6:
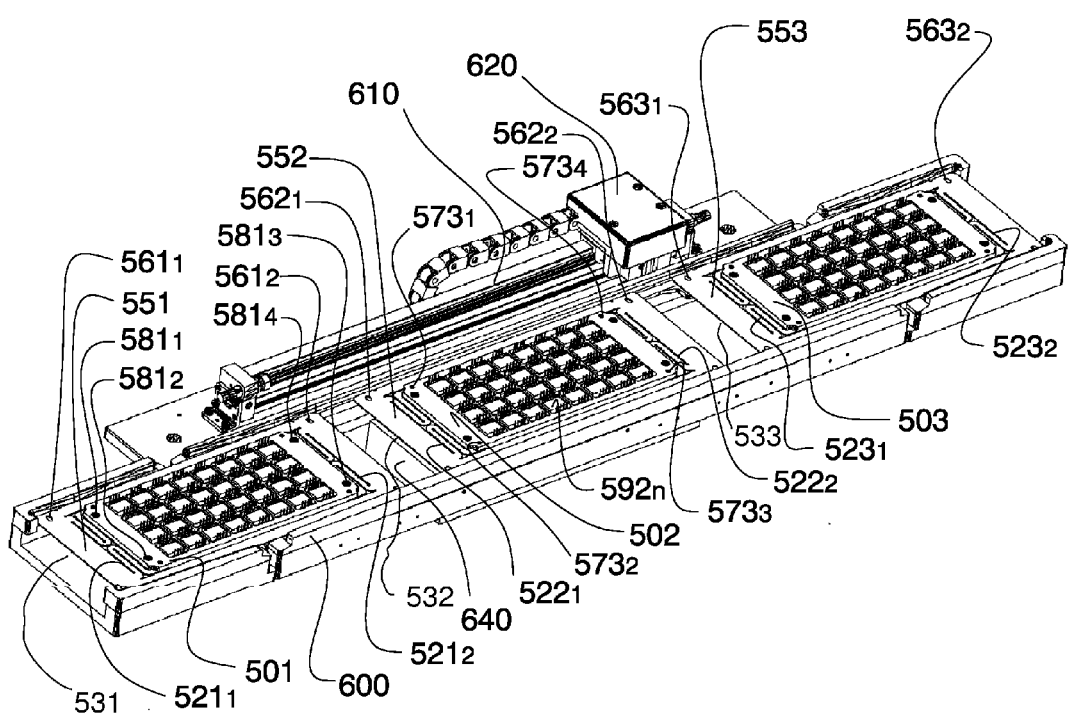
FIG. 6 is a perspective view of carriers being slidably supported on a track and a transport mechanism used to move the carriers to and from a test position, which track and transport mechanism are fabricated in accordance with one or more embodiments of the present invention.

FIG. 6 is a perspective view of carriers 551-553 being slidably supported on track 600 which is used to transport the carriers to and from testing and/or burn-in testing positions in accordance with one or more embodiments of the present invention. As shown in FIG. 6, each of carriers 551-553 includes a mesh of serpentine flat springs (springs $521_1$ and $521_2$; springs $522_1$ and $522_2$; and springs $523_1$ and $523_2$, respectively) that form spring beds for trays 501-503, respectively. In operation, serpentine flat springs $522_1$ and $522_2$ provide resiliency that enables devices held in tray 502 to be urged by a test head (not shown) mounted above tray 502 downwardly into contact with socket 640 mounted below tray 502. As further shown in FIG. 6, trays 501-503 are held in place on frames 531-533 of carriers 551-553, respectively, by four (4) pins (for example, pins $581_1$-$581_4$ affixed to tray 501). As further shown in FIG. 6, mobile trolley 620 mounted to pneumatic drive 610 transports carriers 551-553 along track 600. Pins (not visible in FIG. 6) on trolley 620 engage with transport apertures $562_2$ and $563_1$ on frames 532 and 533, respectively, thereby enabling trolley 620 to move carriers 552 and 553 into position simultaneously. Each end of frames 531, 532 and 533 has one or more transport apertures (transport apertures $561_1$ and $561_2$; transport apertures $562_1$ and $562_2$; and transport apertures $563_1$ and $563_2$, respectively) that enable engagement to frames 531, 532 and 533 for transport from either end of the frames. As further shown in FIG. 6, apertures in the trays (for example, apertures $573_1$-$573_4$ disposed in tray 502) may be used to align the trays with test sockets. In accordance with one or more further embodiments of the present invention, the carriers may be transported by robots, slides, belts, magnetic levitation tracks, or manually, all of which embodiments may be fabricated routinely and without undue experimentation by one of ordinary skill in the art in light of the description herein. Further, in accordance with one or more embodiments of the present invention, various identification marks, alignment features, tracking labels and the like may be added to a carrier in accordance with any one of a number of methods that are well known to one of ordinary skill in the art of conventional semiconductor packaging and testing.

Transport of carriers fabricated in accordance with one or more embodiments of the present invention may be further understood by reference to a top view and a cross sectional side view of a transport mechanism shown in of FIGS. 7A and 7B, respectively, which transport mechanism is fabricated in accordance with one or more embodiments of the present invention. As shown in FIGS. 7A and 7B, carriers $660_1$ and $660_2$ are slidably supported on parallel rails 644. Carriers $660_1$ and $660_2$ resiliently hold trays $650_1$ and $650_2$, respectively, by coupling to springs 662. In accordance with one or more embodiments of the present invention, springs 662 are serpentine flat springs, each of which is attached at a proximal end to a tray and at a distal end to a frame. In accordance with one or more such embodiments, the proximal end of a spring may be coupled to the tray through attachment means that includes, without limitation, a flat piece of material conjoined to the end of the flat spring. In accordance with one or more such embodiments, the structure has features or holes for fasteners that hold the tray to the frame—alternatively the tray may be attached to the structure by an adhesive.

In accordance with one or more embodiments of the present invention, trays $650_1$ and $650_2$ are moved by linear translator 641 which may be, but is not limited to, a rodless pneumatic cylinder that propels trolley 642 in a direction parallel to rails 644. In accordance with one or more such embodiments, pins 648 on trolley 642 (refer to FIG. 7B) are raised by a pneumatic actuator (not visible in FIGS. 7A and 7B), thereby engaging hole $658_2$ in frame $660_1$, and hole $658_1$ in frame $660_2$. Although hole $658_2$ is obscured by pin 648 on one end of frames $660_1$ and $660_2$ in FIGS. 7A and 7B, holes 658 are visible on the other end of the frames. In accordance with one or more such embodiments, both frame $660_1$ and frame $660_2$ are translated simultaneously to the right in FIG. 7A by actuation of linear translator 641. After translation, tray $650_1$ of frame $660_1$ juxtaposed to socket 670 on DUT (device-under-test) board 672. Also, after translation, alignment pins 674 on socket 670 lie poised below alignment holes $656_1$ of tray $650_1$ such that a downward translation of tray $650_1$ causes pins 674 to engage with alignment holes $656_1$, thereby bringing tray $650_1$ into alignment with socket 670. Further, seal bands 676 and 678 on top and bottom surfaces of socket 670 are adapted to make an airtight seal to a sealing surface of tray 650 and to a surface of DUT board 672, respectively.

Figure 8A:
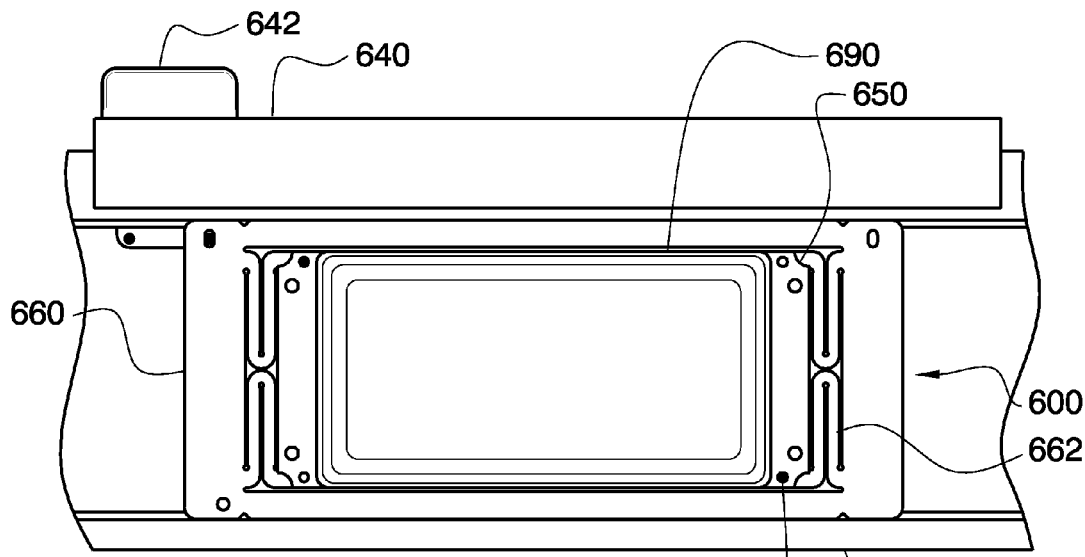
FIG. 8A is a top view of a test site for testing arrays of microelectronic devices disposed in a carrier that is fabricated in accordance with one or more embodiments of the present invention.
Figure 8B:
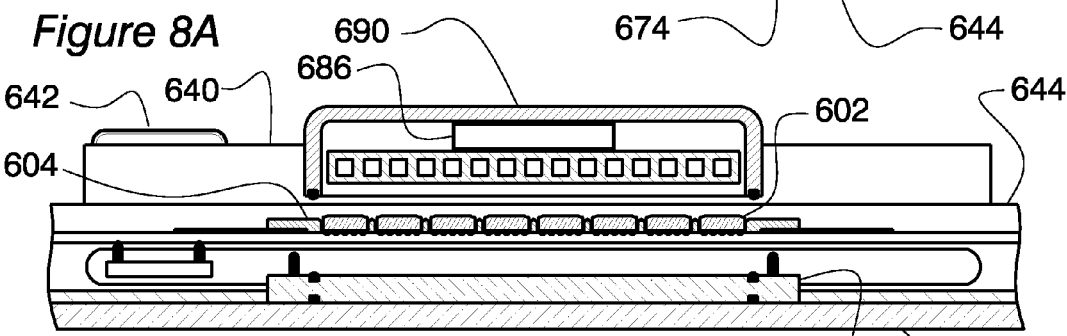
FIGS. 8B-8D are cross sectional views of a test site for testing arrays of microelectronic devices held in a tray supported on a frame of a carrier that is fabricated in accordance with one or more embodiments of the present invention where: (a)
Figure 8C:
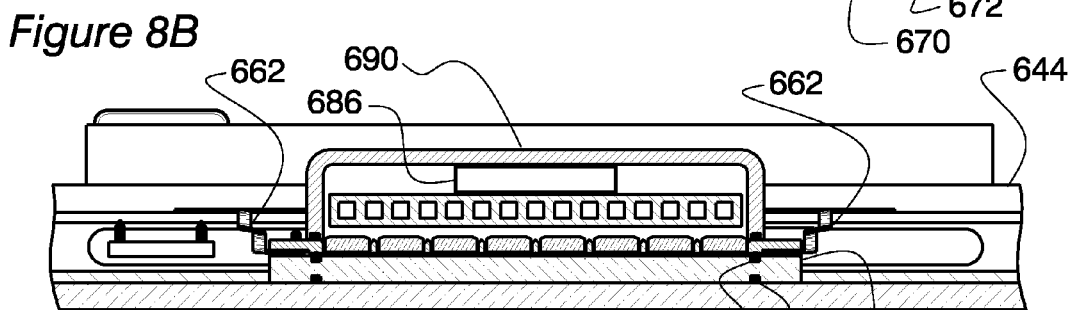
Figure 8D:
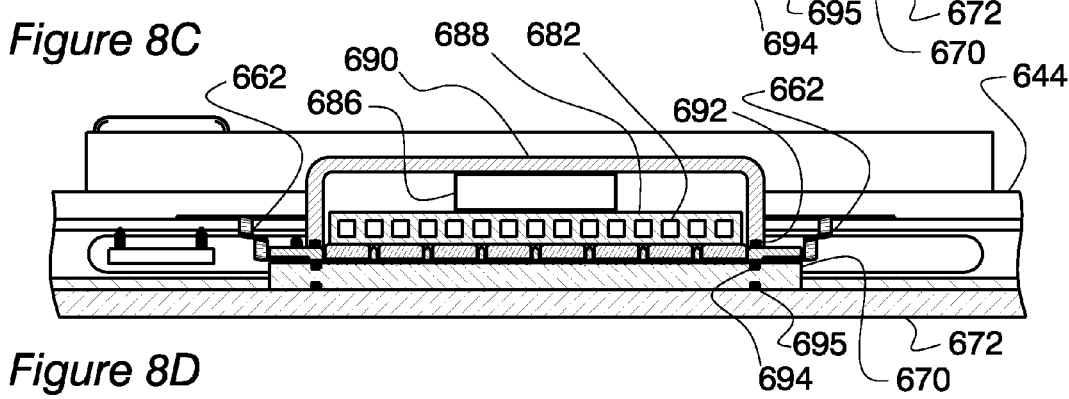

FIG. 8A is a top view of a test site for testing arrays of microelectronic devices disposed in carrier 600 that is fabricated in accordance with one or more embodiments of the present invention. As shown in FIG. 8A, carrier 600 is positioned on rails 644 so that tray 650 (coupled to frame 660 of carrier 600) is under test head 690. FIGS. 8B-8D are cross sectional views of the test site that illustrate steps in contacting microelectronic devices 602 held in tray 650 in accordance with one or more embodiments of the present invention for electrical testing. In particular, FIG. 8B shows tray 650 (in a retracted configuration) positioned under test head 690. As further shown in FIG. 8B, a gap between the bottom of test head 690 and tray 650 and another gap between the top of socket 670 and tray 650 allows lateral translation of frame 660 (and coupled tray 650) in a direction parallel to the body of frame 660. In a next step of the process, illustrated in FIG. 8C, test head 690 is moved vertically into contact with the top of tray 650, thereby urging tray 650 downward into contact with the top of contactor block 640. Downward movement of test head 690 causes springs 662 to extend, thereby enabling tray 650 to move in a direction perpendicular to frame 660. In accordance with one or more embodiments, seal ring 692 around a bottom surface of test head 690 seals to a top surface of a seal band encircling devices in tray 650; and seal ring 694 around a top surface of contactor block 640 seals to a bottom surface of seal band 604. In a next step in the process, illustrated in FIG. 8D, backing plate 688 is urged into contact with devices 602 under test, thereby urging devices 602 into electrical contact with contact block 670. In accordance with one or more embodiments of the present invention, backing plate 688 may be, for example and without limitation, a thermal transfer plate or a cold plate with coolant or thermal transfer fluid circulating through channels 682 contained therein. Further, and in accordance with one or more such embodiments, the step of urging backing plate 688 into contact with devices 602 may be accomplished by means of pneumatic actuator 686. As further shown in FIG. 8D, test head 690 encloses devices 602 in a chamber (test cell) comprising test head 690, seal band 604, contactor block 640 and (optionally) printed circuit 672. In accordance with one or more such embodiments, a controlled gas may be introduced into the chamber to facilitate testing by reducing condensation, increasing thermal transfer, reducing oxidation, inducing chemical reaction, eliminating contaminants, controlling gas pressure, evacuating devices, leak checking, and the like. After electrical testing, test head 690 is returned to a retracted configuration shown in FIG. 8B, thereby freeing carrier 600 for transport. In the above described operation, one of ordinary skill in the art will understand that the step of urging backing plate 688 into contact with devices 602 may be accomplished before moving test head 690 into contact with tray 650. As one of ordinary skill in the art will readily appreciate, the steps described above may be carried out in response to commands provided by a controller (not shown for ease of understanding) such as, for example, a processor, microprocessor, computer and the like. In addition, one of ordinary skill in the art will be able to program such a controller routinely and without undue experimentation in light of the description presented herein. For example and without limitation, the steps may be presented to the controller in the form of a "recipe" or a data structure comprised of collection of data pertaining to various process steps to be carried out for test and/or burn-in operations.

Figure 9A:
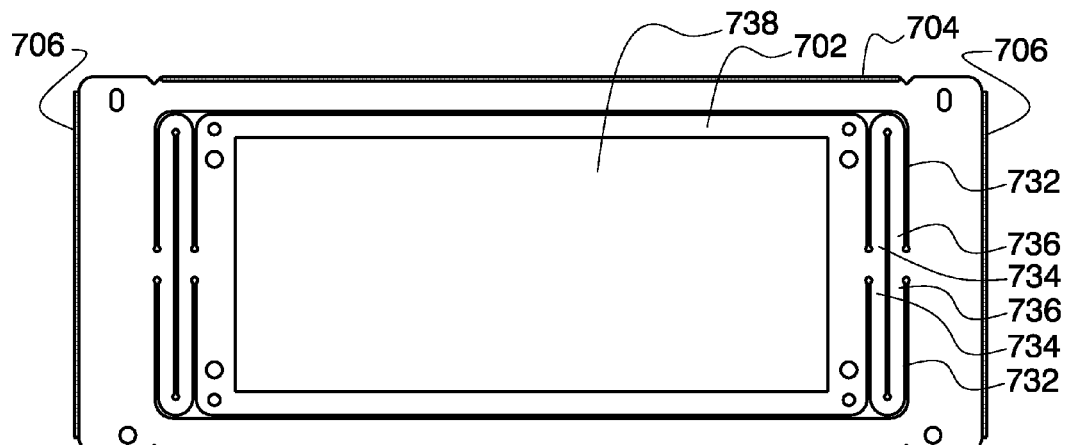
FIGS. 9A-9C show various frames that are fabricated in accordance with one or more embodiments of the present invention.
Figure 9B:
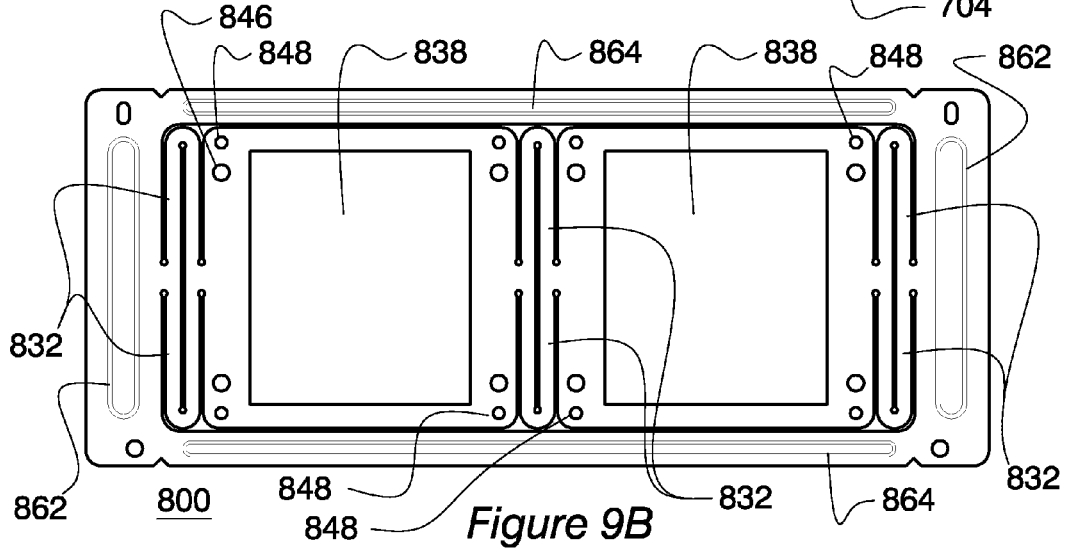
Figure 9C:
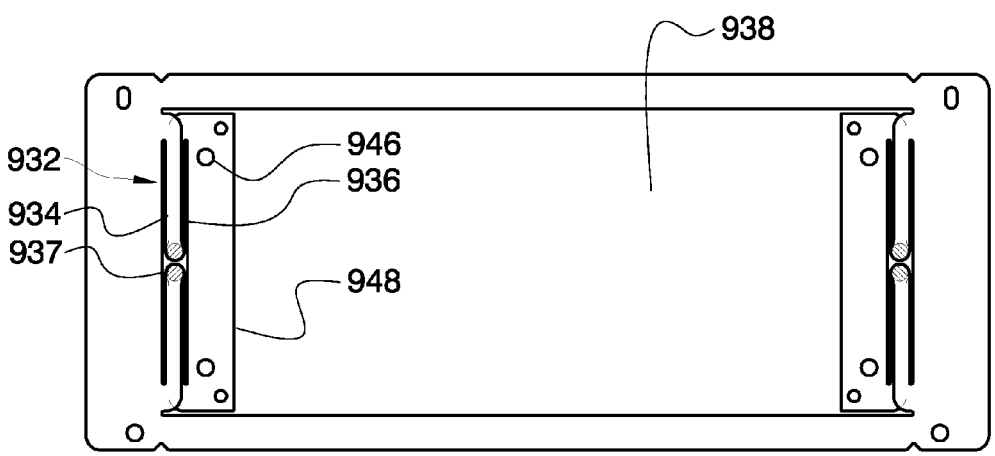

One of ordinary skill in the art will be able to apply principles taught herein to formulate variations in the design of frames in accordance with one or more embodiments of the present invention. FIGS. 9A-9C show various frames that are fabricated in accordance with one or more embodiments of the present invention. As shown in FIG. 9A, frame 700 includes: (a) continuous band 702 around tray opening 738 which is adapted to receive a tray (not shown); and (b) a plurality of springs 732. In accordance with one or more such embodiments, as an alternative to sealing to a tray, a top surface of continuous band 702 may be used to seal to a test head and a bottom surface of continuous band 702 may be used to seal to a contactor block. As further shown in FIG. 9A, each spring 732 has: (a) an end 734 proximal to (i) tray opening 738, and (ii) an attachment means for a tray comprised of an end of band 702; and (b) an end 736 distal from tray opening 738. As further shown in FIG. 9A, pairs of springs 732 are conjoined at proximal ends 734 and at distal ends 736 wherein proximal ends 734 are movable in a direction perpendicular to a plane of frame 700. As further shown in FIG. 9A, longitudinal edges 704 and transverse edges 706 of frame 700 are bent to a right angle to form a flange that adds stiffness to the body of frame 700. As further shown in FIG. 9A, notches 780 along longitudinal edges 704 of frame 700 provide a feature useful for alignment of frame 700. Other means for increasing stiffness of sheets are well known in the art of metal forming. For clarity of exposition, and ease of understanding, labels for elements of frames described previously are omitted from FIG. 9A-9C.

As shown in FIG. 9B, frame 800 is divided into two segments for carrying two trays (not shown) in tray openings 838 and 839. In accordance with one or more embodiments of the present invention, each segment enables registration of trays with alignment pins (for example, alignment pins of a contactor block) that fit through holes 848 disposed in a continuous band of each segment. In accordance with one or more embodiments of the present invention, devices held in trays coupled to the segments may be tested sequentially to enable rapid index times for moving a segment from one position to a next position along the direction of transport of carrier 800. As further shown in FIG. 9B, each segment is suspended on serpentine flat springs 832 to enable individual registration and alignment of trays to a mating contactor block. As further shown in FIG. 9B, stiffness of the body of frame 800 is increased by embossments 862 and 864 in elongated sections of the body.

As shown in FIG. 9C, frame 900 comprises composite springs 932 comprising a first length of spring 934 joined, at joining area 937, to a juxtaposed second length of spring 936 to form a layered leaf spring. In accordance with one or more such embodiments, the leaves of spring 932 are joined at area 937 using any one of a number of methods that are well known to those of ordinary skill in the art such as, for example and without limitation, by brazing, adhesive joining, ultrasonic welding, and the like. As further shown in FIG. 9C, attachment means for attaching a tray (not shown) to the second length of spring 932 is provided as an attachment structure or apron 948 having holes 946 for fasteners used to join a tray to frame 900. Features of frame 900 that were described above are not labeled in FIG. 9C for clarity of exposition and ease of understanding.

Embodiments of the present invention described above are exemplary. As such, many changes and modifications may be made to the description set forth above by those of ordinary skill in the art while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A carrier for holding microelectronic devices comprises:
   a tray having one or more sites adapted to hold a microelectronic device, the tray including a seal band that encircles the sites to provide a top sealing surface; and
   a frame resiliently coupled to the tray so the tray is movable with respect to the frame;
   wherein: the frame is resiliently coupled to the tray by two or more springs coupled to the frame and the tray, the two or more springs are flat springs, and the two or more flat springs are serpentine springs.

2. The carrier of claim 1 wherein the frame includes an opening in which the tray may be disposed, the opening is in a plane and the tray is movable in a direction perpendicular to the plane.

3. The carrier of claim 2 wherein a portion of the frame lies in the plane.

4. The carrier of claim 3 wherein a portion of one or more edges of the frame are bent out of the plane.

5. A carrier for holding microelectronic devices comprises:
   a tray having one or more sites adapted to hold a microelectronic device, the tray including a seal band that encircles the sites to provide a top sealing surface; and
   a frame resiliently coupled to the tray so the tray is movable with respect to the frame;
   wherein the tray is comprised of a metal.

6. A frame for a carrier that holds a tray of microelectronic devices comprises:
   a first band surrounding an opening;
   a second band disposed in the opening and adapted to be coupled to the tray;
   two or more springs coupled to the first band and the second band so that the second band is movable relative to the opening;
   wherein:
   the first band includes one or more surfaces that lie in a plane and are adapted to slidably contact two or more transport rails, the opening lies in the plane,
   the first band is planar, and
   each of the springs is a serpentine flat spring coupled between the first band and the second band.

7. A frame for a carrier that holds a tray of microelectronic devices comprises:
   a first band surrounding an opening;
   a second band disposed in the opening and adapted to be coupled to the tray;
   two or more springs coupled to the first band and the second band so that the second band is movable relative to the opening;
   wherein: the first band includes one or more surfaces that lie in a plane and are adapted to slidably contact two or more transport rails, and
   a portion of one or more edges of the first band are bent out of the plane.

* * * * *